(12) United States Patent
Wang et al.

(10) Patent No.: US 9,548,656 B1
(45) Date of Patent: Jan. 17, 2017

(54) LOW VOLTAGE RIPPLE CHARGE PUMP WITH SHARED CAPACITOR OSCILLATOR

(71) Applicant: FREESCALE SEMICONDUCTOR, INC., Austin, TX (US)

(72) Inventors: Yang Wang, Suzhou (CN); Jie Jin, Suzhou (CN); Jianzhou Wu, Suzhou (CN); Hao Zhi, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/139,306

(22) Filed: Apr. 26, 2016

(30) Foreign Application Priority Data

Aug. 14, 2015 (CN) .......................... 2015 1 0583357

(51) Int. Cl.
  *H02M 3/07* (2006.01)
  *H03K 5/24* (2006.01)
  *H03K 21/02* (2006.01)

(52) U.S. Cl.
  CPC .................. *H02M 3/07* (2013.01); *H03K 5/24* (2013.01); *H03K 21/02* (2013.01)

(58) Field of Classification Search
  CPC .. H02M 3/07; H02M 3/073; H02M 2003/075; H02M 2003/077
  See application file for complete search history.

(56) References Cited

U.S. PATENT DOCUMENTS

| | | |
|---|---|---|
| 5,168,174 A | 12/1992 | Naso |
| 5,818,766 A | 10/1998 | Song |
| 7,256,641 B2 * | 8/2007 | Namekawa ........... H02M 3/073 327/536 |
| 7,365,585 B2 | 4/2008 | Fort |
| 8,497,719 B2 | 7/2013 | Cavalliini |
| 2006/0233770 A1 * | 10/2006 | Ambinder .......... A61K 39/0011 424/93.21 |

OTHER PUBLICATIONS

Jae-Youl Lee et al., "A Regulated Charge Pump With Small Ripple Voltage and Fast Start-Up", IEEE Journal of Solid-State Circuits, vol. 41, No. 2, Feb. 2006. pp. 425-432.
Chi-Hao Wu and Chern-Lin Chen, "A Low-Ripple Charge Pump with Continuous Pumping Current Control", IEEE 978-1-4244-2167-1/08, © 2008.

\* cited by examiner

*Primary Examiner* — Jeffrey Zweizig
(74) *Attorney, Agent, or Firm* — Charles E. Bergere

(57) ABSTRACT

A low voltage ripple charge pump with slew rate control includes a frequency divider, a clock generator, a current mirror, a switching circuit, a diode network, two capacitors, and a comparator. The frequency divider generates a clock signal from an oscillating signal. The clock generator generates first and second clock signals from the clock signal. The current mirror generates first and second current signals using a reference current. The switching circuit generates first and second voltage signals using the first and second clock signals and the first and second current signals. The comparator generates the oscillating signal based on the first and second voltage signals. The capacitors receive the voltage signals and are connected to the diode network for generating an output signal. The charge pump has low output voltage ripple with small filtering capacitance, which is achieved via slew rate control.

11 Claims, 3 Drawing Sheets

LOW VOLTAGE RIPPLE CHARGE PUMP WITH SHARED CAPACITOR OSCILLATOR

BACKGROUND

The present invention generally relates to integrated circuits, and more particularly, to a charge pump.

Integrated circuits (ICs) such as system-on-chips (SoCs) and application specific integrated circuits (ASICs) include various analog and digital circuits such as phase-locked loops (PLLs), delay-locked loops (DLLs), analog-to-digital converters (ADCs), digital-to-analog converters (DACs), and memories. These circuits require different supply voltages, so an IC that receives a single power supply voltage often includes a charge pump. The charge pump is a voltage converter that includes capacitors to store and transfer energy. The charge pump receives an input supply voltage and generates an output voltage signal at a voltage level that is different from the voltage level of the input supply voltage.

FIG. 1 is a schematic block diagram of a conventional charge pump 100. The charge pump 100 receives a supply voltage ($V_{DD}$) and generates an output signal ($V_{OUT}$). The charge pump 100 includes an automatic pumping current control circuit 102 and an automatic frequency control circuit 104. The automatic pumping current control circuit 102 includes a first buffer 106, a main charge pump circuit 108, a buffer circuit 110, and a voltage detector 112. The main charge pump circuit 108 includes first through third transistors 114-118, and first and second capacitors 120 and 122. The buffer circuit 110 includes second through fifth buffers 124-130. The voltage detector 112 includes a voltage reference circuit 132, first through fourth resistors 134-140, and first through third comparators 142-146. The automatic frequency control circuit 104 includes a fourth comparator 148, a voltage-controlled oscillator (VCO) 150, and a fifth resistor 152. The charge pump 100 is further connected to a third capacitor 154 and a sixth resistor 156.

The voltage detector 112 receives the output signal and generates a voltage detection signal ($V_{DET}$) indicative of a voltage level of the output signal. The resistors 134-138 scale the voltage level of the output signal and generate first through third voltage signals ($V_1$, $V_2$, and $V_3$). The voltage reference circuit 132 generates a reference voltage ($V_{REF}$). The first comparator 142 compares the reference voltage $V_{REF}$ with the first voltage signal $V_1$ and generates a first comparison signal ($V_{COMP1}$). The second comparator 144 compares the reference voltage $V_{REF}$ with the second voltage signal $V_2$ and generates a second comparison signal ($V_{COMP2}$). The third comparator 146 compares the reference voltage $V_{REF}$ with the third voltage signal $V_3$ and generates a third comparison signal ($V_{COMP3}$). The fourth comparator 148 receives the voltage reference signal from the voltage reference circuit 132, and the voltage detection signal from the fourth resistor 140, compares them, and generates a fourth comparison signal ($V_{COMP4}$).

The VCO 150 receives the fourth comparison signal and generates an oscillating signal ($V_{OSC}$). The first buffer 106 is connected to the VCO 150 and receives the oscillating signal and provides a buffered signal ($V_{BUF}$). The fifth resistor 152 is connected to the fourth resistor 140 for receiving the voltage detection signal, and to ground.

The second buffer 124 is connected to the output of the first buffer 106, receives the buffered signal, and generates a first current signal ($I_1$). The third buffer 126 receives the buffered signal from the first buffer 106; the third buffer also has a control terminal connected to the output of the first comparator 142 for receiving the first comparison signal. Based on the first comparison signal, the third buffer 126 generates a second current signal ($I_2$). The fourth buffer 128 is connected to the output of the first buffer 106 and receives the buffered signal, and has a control terminal connected to the output of the second comparator 144 for receiving the second comparison signal. Based on the second comparison signal, the fourth buffer 128 generates a third current signal ($I_3$). The fifth buffer 130 is connected to the output of the first buffer 106 for receiving the buffered signal and has a control terminal connected to the output of the third comparator 146 for receiving the third comparison signal. Based on the third comparison signal, the fifth buffer 130 generates a fourth current signal ($I_4$).

The first transistor 114 has a source that receives the supply voltage and a gate connected to its drain, so the first transistor 114 functions as a diode. The second transistor 116 has a source that receives the supply voltage and a gate connected to its drain so that it too functions as a diode. The third transistor 118 has its source connected to the drain of the second transistor 116, its gate connected to the drain of the first transistor 114, and its drain generates the output signal.

The first and second capacitors 120 and 122 are connected to the drains of the first and second transistors 114 and 116, respectively. The first capacitor 120 also is connected to the output of the first buffer 106 for receiving the buffered signal, while the second capacitor 122 also is connected to the outputs of the second through fifth buffers 124-130.

The VCO 150 varies a frequency of the oscillating signal based on the fourth comparison signal. Thus, the automatic frequency control circuit 104 controls a frequency of the oscillating signal, which controls the charging rate of the second capacitor 122.

The buffer circuit 110 provides current to the second capacitor 122 by adjusting the current supplied to the second capacitor 122 based on the first through third comparison signals. When the voltage level of the output signal is less than a threshold voltage, the buffer circuit 110 uses the second through fifth buffers 124-130 for supplying maximum current to the second capacitor 122. As the voltage level of the output signal rises, the buffer circuit 110 step-wise reduces the current supplied to the second capacitor 122 to a current level of the first current signal.

Thus, the charge pump 100 controls the charging rate of the second capacitor 122, thereby regulating the voltage level of the output signal and reducing ripples introduced in the output signal. The third capacitor 154 further reduces ripples in the output signal supplied to the sixth resistor 156, which acts as a load. Thus, the charge pump 100 regulates the voltage level of the output signal based on the load variation.

However, the charge pump 100 requires four comparators, which increases its circuit area. Further, the charge pump 100 step-wise changes the current supplied to the second capacitor 122 depending on the voltage level of the output signal. Hence, the charge pump 100 reduces the ripples in the output signal in discrete steps. Further, a size of the third capacitor 154 required to reduce high frequency ripples is large, which further increases the circuit area.

Other known techniques for reducing ripples in the output signal utilize an external clock source that generates an oscillating signal at a constant frequency and hence, require complex circuits that increase both area and power.

Therefore, it would be advantageous to have a charge pump that reduces ripples in an output signal thereof and has reduced area and power.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
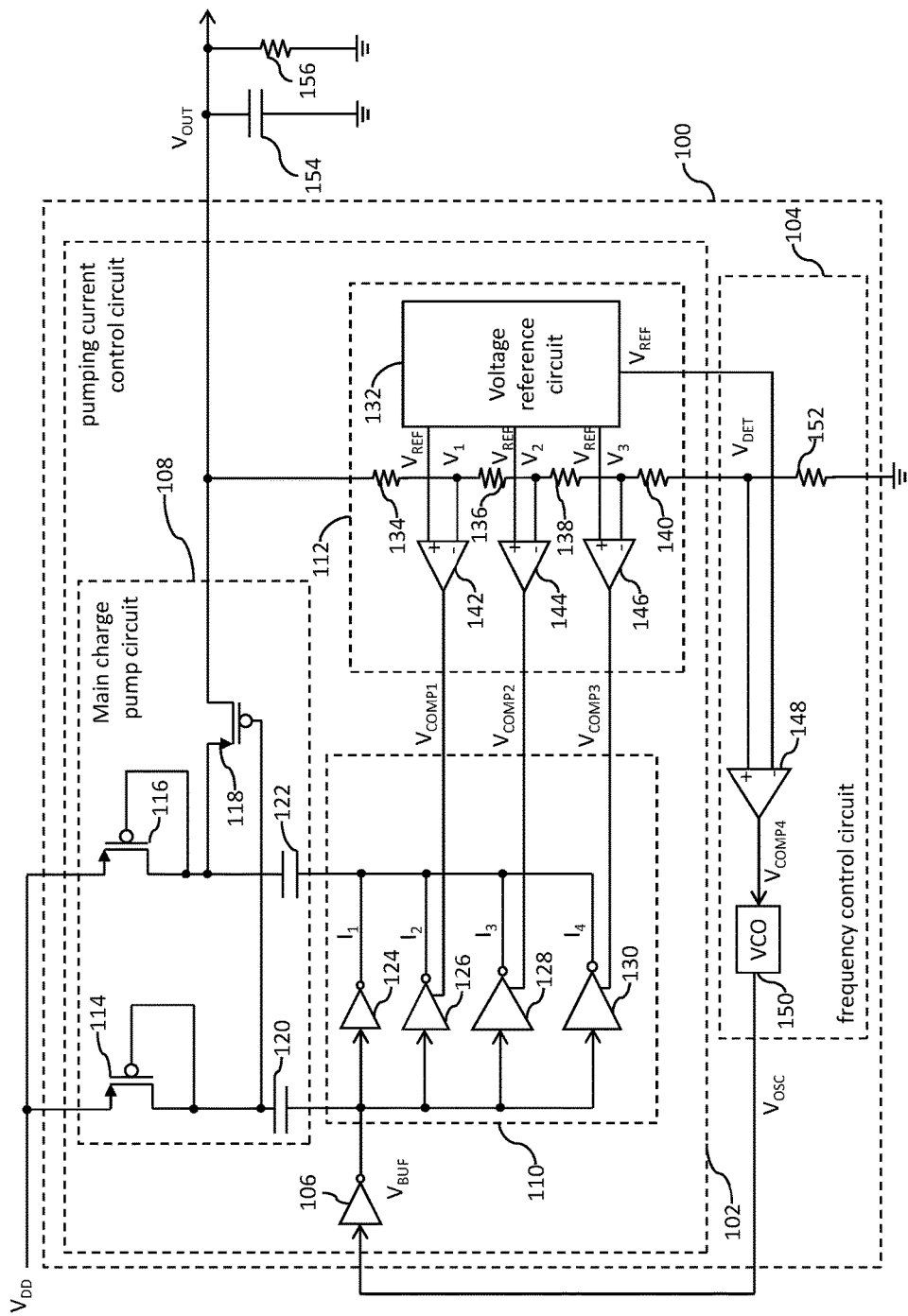
FIG. 1 is a schematic block diagram of a conventional charge pump.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a charge pump is provided. The charge pump includes a frequency divider, a clock generation circuit, a current mirror circuit, a switching circuit, first through fourth diodes, first and second capacitors, a comparison circuit, a voltage detector, and a voltage controlled current source (VCCS). The frequency divider receives an oscillating signal and generates a clock signal. The clock generation circuit receives the clock signal and generates first and second clock signals having first and second phases, respectively. The current mirror circuit receives a supply voltage and generates first and second current signals based on a reference current signal. The switching circuit receives a first reference voltage, the first and second clock signals, and the first and second current signals, and generates first and second voltage signals. The first and second diodes receive the supply voltage. The first and second capacitors receive the first and second voltage signals, respectively. The comparison circuit receives a second reference voltage and the first and second voltage signals, compares the first and second voltage signals with the second reference voltage, and generates the oscillating signal. The third and fourth diodes generate an output signal. The voltage detector receives the output signal and generates a voltage detection signal indicative of a voltage level of the output signal. The VCCS receives the voltage detection signal and generates the reference current signal.

The charge pump does not require an external clock source for controlling charging and discharging of the first and second capacitors. The charge pump uses the first and second capacitors for generating the oscillating signal and maintains a desired voltage level of the output signal. This reduces the circuit area since no additional hardware is needed to control the charging and discharging of the first and second capacitors. This reduction in circuitry also leads to a reduction in power. Further, based on the reference current signal, the current mirror circuit changes levels of the first and second current signals for charging the first and second capacitors, i.e., the current mirror circuit does not change the amount of current supplied to the first and second capacitors in a step-wise manner. This reduces ripples in the output signal.

In another embodiment of the present invention, a charge pump is provided. The charge pump includes a frequency divider, a clock generation circuit, a current mirror circuit, a switching circuit, first through fourth diodes, first and second capacitors, a comparison circuit, a voltage detector, and a voltage controlled current source (VCCS). The switching circuit includes first through fourth switches. The frequency divider receives an oscillating signal and generates a clock signal. The clock generation circuit receives the clock signal and generates first and second clock signals having first and second phases, respectively. The current mirror circuit receives a supply voltage and generates first and second current signals based on a reference current signal. The switching circuit receives a first reference voltage, the first and second clock signals, and the first and second current signals, and generates first and second voltage signals. The first switch receives a first reference voltage and the first clock signal. The second switch receives the first reference voltage and the second clock signal. The third switch receives the first current signal and the first clock signal, and generates a first voltage signal. The fourth switch receives the second current signal and the second clock signal, and generates a second voltage signal. The first and second diodes receive the supply voltage. The first and second capacitors receive the first and second voltage signals, respectively. The comparison circuit receives a second reference voltage and the first and second voltage signals, compares the first and second voltage signals with the second reference voltage, and generates the oscillating signal. The third and fourth diodes generate an output signal. The voltage detector receives the output signal and generates a voltage detection signal indicative of a voltage level of the output signal. The VCCS receives the voltage detection signal and generates the reference current signal.

Various embodiments of the present invention provide a charge pump. The charge pump includes a frequency divider, a clock generation circuit, a current mirror circuit, a switching circuit, first through fourth diodes, first and second capacitors, a comparison circuit, a voltage detector, and a voltage controlled current source (VCCS). The charge pump generates an output signal. The voltage detector detects a voltage level of the output signal ad generates a voltage detection signal. The VCCS generates a reference current signal based on the voltage detection signal. The current mirror circuit receives a supply voltage and generates first and second current signals based on the reference current signal. The switching circuit generates first and second voltage signals based on the first and second current signals, a first reference voltage, and first and second clock signals. The comparison circuit compares the first and second voltage signals with a second reference signal for generating an oscillating signal. The frequency divider generates a clock signal based on the oscillating signal. The first and second diodes receive the supply voltage at respective anodes. The first and second capacitors have first terminals for receiving the first and second voltage signals, respectively, and second terminals connected to cathodes of the first and second diodes, respectively. The third and fourth diodes have anodes connected to the cathodes of the first and second diodes, respectively. A cathode of the third diode is connected to a cathode of the fourth diode for generating the output signal.

Figure 2:
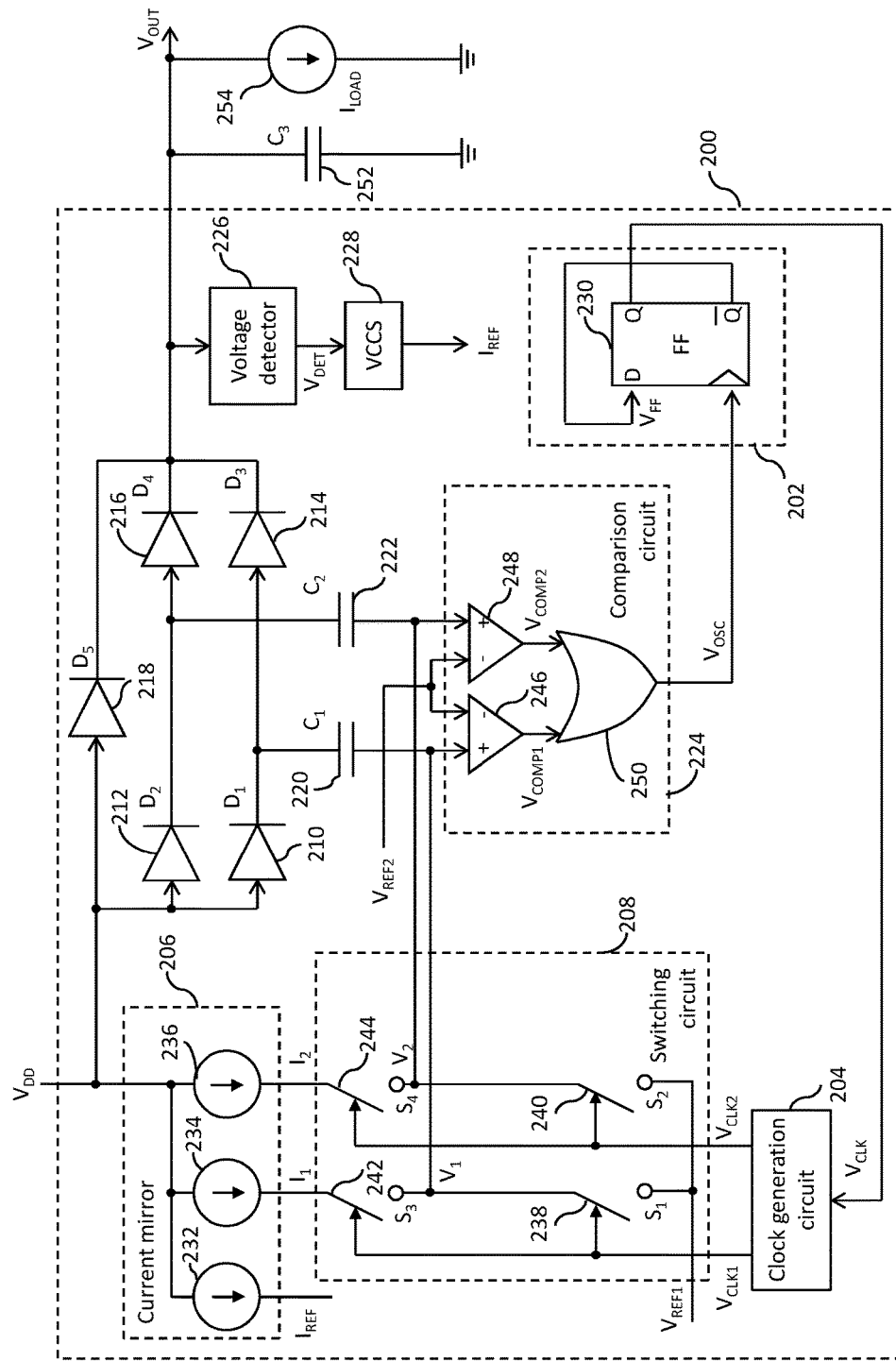
FIG. 2 is a schematic block diagram of a charge pump in accordance with an embodiment of the present invention.

Referring now to FIG. 2, a schematic block diagram of a charge pump 200 in accordance with an embodiment of the present invention is shown. The charge pump 200 includes a frequency divider 202, a clock generation circuit 204, a current mirror circuit 206, a switching circuit 208, first through fifth diodes 210-218, first and second capacitors 220 and 222, a comparator 224, a voltage detector 226, and a voltage controlled current source (VCCS) 228. The frequency divider 202 includes a D flip-flop 230. The current mirror circuit 206 includes first through third current sources 232-236. The switching circuit 208 includes first through fourth switches 238-244. The comparator 224 includes first and second comparators 246 and 248 and a logic gate 250. The charge pump 200 is connected to a third capacitor 252 and a load circuit 254.

The D flip-flop 230 has an data input terminal for receiving a flip-flop output signal ($V_{FF}$) and a clock terminal for receiving an oscillating signal ($V_{OSC}$). The D flip-flop 230 has a first output terminal at which a clock signal ($V_{CLK}$) is provided and a second output terminal that provides the flip-flop output signal. Thus, the frequency divider 202 functions as a divide-by-2 counter.

The clock generation circuit 204 is connected to the first output terminal of the D flip-flop 230 for receiving the clock signal. The clock generation circuit 204 generates first and second clock signals ($V_{CLK1}$ and $V_{CLK2}$) at first and second phases, respectively.

A reference current signal ($I_{REF}$) flows through the first current source 232. The second and third current sources 234 and 236 mirror the reference current signal and generate first and second current signals (hereinafter referred to as "first current" and "second current", respectively), respectively. Thus, the current mirror circuit 206 receives a supply voltage ($V_{DD}$) and generates the first and second currents based on the reference current signal.

The first switch 238 has a first terminal for receiving a first reference voltage ($V_{REF1}$) and a second terminal connected to the clock generation circuit 204 for receiving the first clock signal. The second switch 240 has a first terminal for receiving the first reference voltage and a second terminal connected to the clock generation circuit 204 for receiving the second clock signal. The third switch 242 has a first terminal connected to the current mirror circuit 206 for receiving the first current signal, a second terminal connected to the clock generation circuit 204 for receiving the first clock signal, and a third terminal connected to a third terminal of the first switch 238 for generating a first voltage signal ($V_1$). The fourth switch 244 has a first terminal connected to the current mirror circuit 206 for receiving the second current signal, a second terminal connected to the clock generation circuit 204 for receiving the second clock signal, and a third terminal connected to a third terminal of the second switch 240 for generating a second voltage signal ($V_2$). The first and second diodes 210 and 212 have anodes for receiving the supply voltage. The first capacitor 220 has a first terminal connected to the third terminal of the third switch 242 for receiving the first voltage signal and a second terminal connected to a cathode of the first diode 210. The second capacitor 222 has a first terminal connected to the third terminal of the fourth switch 244 for receiving the second voltage signal and a second terminal connected to a cathode of the second diode 212.

The first comparator 246 has a first input for receiving a second reference voltage ($V_{REF2}$) and a second input connected to the third terminal of the third switch 242 for receiving the first voltage signal. The first comparator 246 compares the first voltage signal with the second reference voltage $V_{REF2}$ and generates a first comparison signal ($V_{COMP1}$).

The second comparator 248 has a first input for receiving the second reference voltage $V_{REF2}$ and a second input connected to the third terminal of the fourth switch 244 for receiving the second voltage signal. The second comparator 248 compares the second voltage signal with the second reference voltage $V_{REF2}$ and generates a second comparison signal ($V_{COMP2}$).

In the embodiment shown, the logic gate 250 is an OR gate. The logic gate 250 has first and second inputs connected to the outputs of the first and second comparators 246 and 248 for receiving the first and second comparison signals, and then generates the oscillating signal at its output.

The third and fourth diodes 214 and 216 have anodes connected to the cathodes of the first and second diodes 210 and 212, respectively. The cathode of the third diode 214 is connected to a cathode of the fourth diode 216 for generating an output signal ($V_{OUT}$).

The voltage detector 226 is connected to the cathodes of the third and fourth diodes 214 and 216 for receiving the output signal. The voltage detector 226 generates a voltage detection signal ($V_{DET}$) indicative of a voltage level of the output signal.

The VCCS 228 is connected to the voltage detector 226 for receiving the voltage detection signal. The VCCS 228 generates the reference current signal (hereinafter referred to as "reference current").

The third capacitor 252 has a first terminal connected to the cathodes of the third and fourth diodes 214 and 216 for receiving the output signal and a second terminal connected to ground.

The fifth diode 218 has an anode for receiving the supply voltage and a cathode connected to the cathodes of the third and fourth diodes 214 and 216. The fifth diode 218 charges an output node of the charge pump 200 to a voltage level equal to a differential of the voltage level of the supply voltage and a threshold of the fifth diode 218, thereby reducing a start-up time of the charge pump 200.

Figure 3:
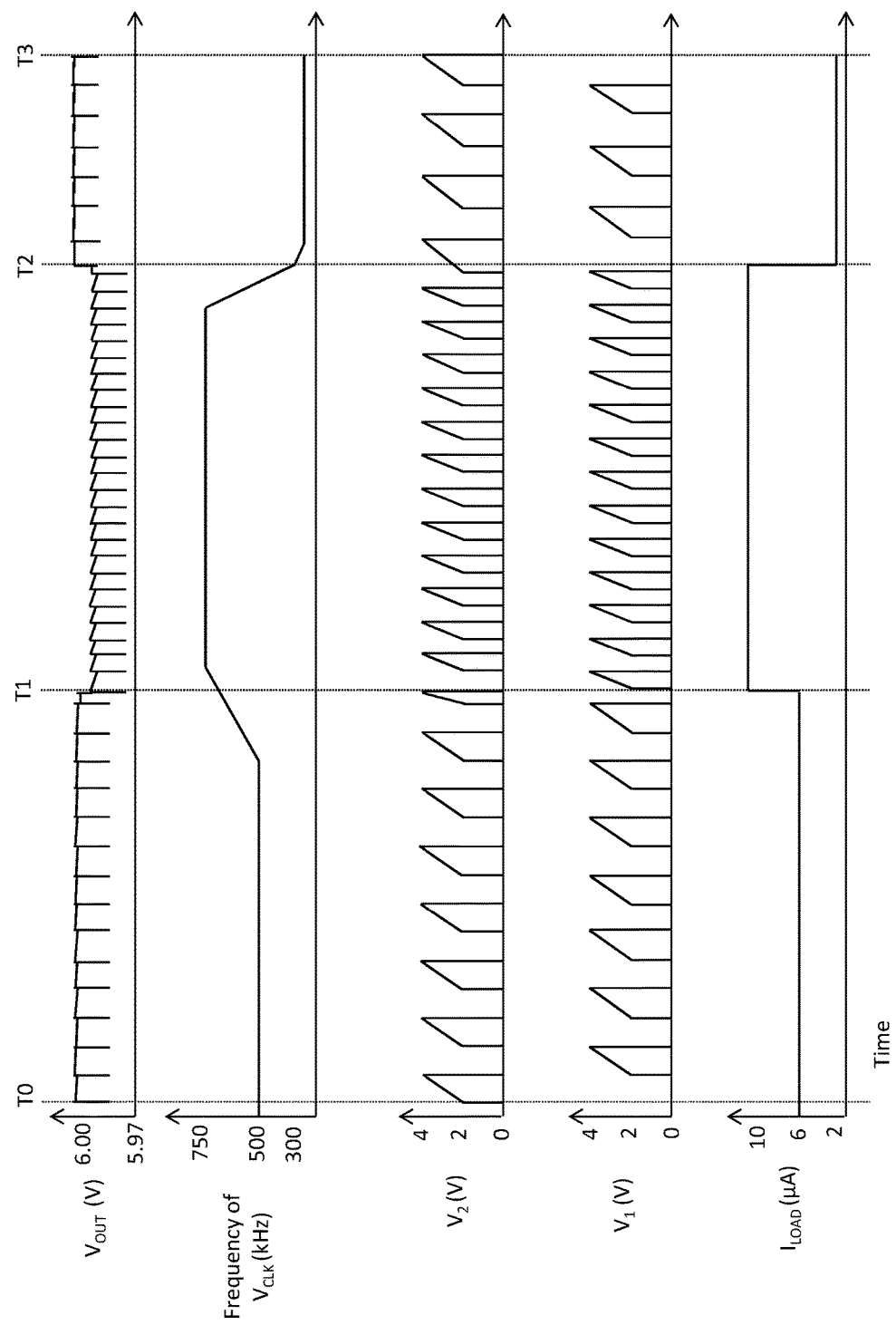
FIG. 3 is a timing diagram illustrating operation of the charge pump of FIG. 2 in accordance with an embodiment of the present invention.

Referring now to FIG. 3, a timing diagram illustrating an operation of the charge pump 200 in accordance with an embodiment of the present invention is shown. In one embodiment, the first and second switches 238 and 240 are n-channel metal-oxide semiconductor (NMOS) transistors and the third and fourth switches 242 and 244 are p-channel metal-oxide semiconductor (PMOS) transistors. The voltage level of the supply voltage is 5 volt (V) and a voltage level of the second reference voltage is 4V. The first terminals of the first and second switches 238 and 240 are connected to ground. Thus, a voltage level of the first reference voltage is 0V. The frequencies of the first and second clock signals are equal to the frequency of the clock signal, and the first clock signal is 180 degrees out of phase with the second clock signal.

When the clock generation circuit 204 generates the first clock signal at a logic low state, the second clock signal is at a logic high state. Thus, the first and fourth switches 238 and 244 are open and the second and third switches 240 and 242 are closed. The current mirror circuit 206 charges the first capacitor 220 to a voltage level that is slightly greater than the voltage level of the second reference voltage by way of the third switch 242. The second capacitor 222 is discharged to ground by way of the second switch 240. When the clock generation circuit 204 generates the first clock signal at a logic high state, the second clock signal is at a logic low state. Thus, the first and fourth switches 238 and 244 are closed and the second and third switches 240 and 242 are open. The current mirror circuit 206 charges the second capacitor 222 to a voltage level that is slightly greater than the voltage level of the second reference voltage by way of the fourth switch 244. The first capacitor 220 is discharged to ground by way of the first switch 238. Thus, when the first capacitor 220 is charged to 4V, the second capacitor 222 is discharged to ground and when the second capacitor 222 is charged to 4V, the first capacitor 220 is discharged to ground.

When the voltage level to which the first capacitor 220 is charged and the voltage level to which the second capacitor 222 is charged are less than the second reference voltage $V_{REF2}$, the comparator 224 generates the oscillating signal at a logic low state. When the voltage level of the first capacitor 220 is slightly greater than the voltage level of the second reference voltage $V_{REF2}$, the first comparator 246 generates the first comparison signal at a logic high state. Since the second comparison signal is low, the comparator 224 generates the oscillating signal at a logic high state, i.e., the logic state of the oscillating signal changes from low to high. When the voltage level to which the second capacitor 222 is charged is slightly greater than the second reference voltage $V_{REF2}$, the second comparator 248 generates the second comparison signal at a logic high state. Since the first comparison signal is at a logic low state, the comparator 224 generates the oscillating signal at a logic high state, i.e., the logic state of the oscillating signal goes from low to high. Thus, a frequency of the oscillating signal is twice the charging and discharging frequency of either of the first and second capacitors 220 and 222.

At time T0, the voltage level of the output signal is approximately equal to 6V. The VCCS 228 generates the reference current at a level of 6 microamperes (μA). The frequency divider 202 generates the clock signal at a frequency of 500 kilohertz (kHz). The first clock signal is 180 degrees out of phase with the second clock signal. A load current ($I_{LOAD}$) required by the load circuit 254 is 6 μA.

From time T0-T1, as the load current does not change (i.e., there is no load variation), the charge pump 200 continues to generate the output voltage approximately at a voltage level of 6V. Hence, the VCCS 228 continues to generate the reference current at 6 μA. The load current required by the load circuit 254 is 6 μA.

At time T1, the load current increases from 6 μA to 10 μA. Thus, from time T1-T2, the VCCS 228 increases the level of the reference current to 10 μA. Thus, the clock generation circuit 204 generates the first and second clock signals at a frequency of 750 kHz, thereby increasing the charging and discharging frequency of the first and second capacitors 220 and 222. As the charging and discharging frequency of the first and second capacitors 220 and 222 increases, the voltage level of the output signal is quickly restored to approximately 6V in a short period of time.

At time instance T2, the load current decreases from 10 μA to 2 μA. Thus, during time period T2-T3, the VCCS 228 decreases the level of the reference current to 2 μA. Thus, the clock generation circuit 204 generates the first and second clock signals at a frequency of 300 kHz, thereby decreasing the charging and discharging frequency of the first and second capacitors 220 and 222. As the charging and discharging frequency of the first and second capacitors 220 and 222 decreases, the voltage level of the output signal is restored to 6V.

Thus, from time T2-T3, the load current does not change and the VCCS 228 generates the reference current at the level of 2 μA. The clock generation circuit 204 generates the first and second clock signals at a frequency of 300 kHz. Thus, the charge pump 200 generates the output signal at the level of 6V.

The charge pump 200 does not require an external clock source to control the charging and discharging of the first and second capacitors 220 and 222. The charge pump 200 uses the first and second capacitors 220 and 222 for generating the oscillating signal and maintaining the voltage level of the output signal. This reduces the circuit area since no additional circuitry for controlling the charging and discharging of the first and second capacitors 220 and 222 is needed. Moreover, as the amount of circuitry is reduced, the power consumed by the charge pump 200 is reduced.

The ripples in the output signal are due to propagation delay by the components of the charge pump 200. However, the current mirror circuit 206 changes the level of the first and second currents based on the level of the reference current. Hence, the current mirror circuit 206 does not wait for the voltage level of the output signal to go below a threshold level, i.e., the current mirror circuit 206 continuously changes the level of the first and second currents for charging the first and second capacitors 220 and 222, and does not change the levels of the first current and the second current in a step-wise manner. This reduces ripples in the output signal. As the ripples in the output signal are reduced, the size of the third capacitor 252 can be reduced, which further reduces the circuit area. Thus, the time required for restoring the voltage level of the output signal is reduced.

It will be understood by those of skill in the art that the frequency divider 202, the clock generation circuit 204, the current mirror circuit 206, the switching circuit 208, the comparator 224, the voltage detector 226, and the VCCS 228 can be implemented in several different ways and will lie under the scope of the invention. Further, transistors required for implementing the switching circuit 208 depend on the voltage level of the first and second reference voltages.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A charge pump, comprising:
    a frequency divider for receiving an oscillating signal and generating a clock signal;
    a clock generation circuit connected to the frequency divider for receiving the clock signal and generating first and second clock signals having first and second phases, respectively;
    a current mirror circuit that receives a supply voltage and generates first and second current signals based on a reference current signal;

a switching circuit that receives a first reference voltage, and is connected to the clock generation circuit for receiving the first and second clock signals and to the current mirror circuit for receiving the first and second current signals, and generates first and second voltage signals;

first and second diodes having anodes that receive the supply voltage;

first and second capacitors having first terminals connected to the switching circuit for receiving the first and second voltage signals, respectively, and second terminals connected to cathodes of the first and second diodes, respectively;

a comparator that receives a second reference voltage, and connected to the switching circuit for receiving the first and second voltage signals, compares the first and second voltage signals with the second reference voltage, and generates the oscillating signal;

third and fourth diodes having anodes connected to the cathodes of the first and second diodes, respectively, wherein a cathode of the third diode is connected to a cathode of the fourth diode for generating an output signal;

a voltage detector connected to the cathodes of the third and fourth diodes for receiving the output signal and generating a voltage detection signal indicative of a voltage level of the output signal; and a voltage controlled current source (VCCS) connected to the voltage detector for receiving the voltage detection signal and generating the reference current signal.

2. The charge pump of claim 1, further comprising a third capacitor having a first terminal connected to the cathodes of the third and fourth diodes for receiving the output signal and a second terminal connected to ground.

3. The charge pump of claim 1, wherein the switching circuit comprises:

a first switch having a first input that receives the first reference voltage and a second input connected to the clock generation circuit for receiving the first clock signal;

a second switch having a first input that receives the first reference voltage and a second input connected to the clock generation circuit for receiving the second clock signal;

a third switch having a first terminal connected to the current mirror circuit for receiving the first current signal, a second terminal connected to the clock generation circuit for receiving the first clock signal, and a third terminal connected to a third terminal of the first switch for generating the first voltage signal; and a fourth switch having a first terminal connected to the current mirror circuit for receiving the second current signal, a second terminal connected to the clock generation circuit for receiving the second clock signal, and a third terminal connected to a third terminal of the second switch for generating the second voltage signal.

4. The charge pump of claim 1, wherein the comparator comprises:

a first comparator having a first input that receives the second reference voltage, a second input connected to the switching circuit for receiving the first voltage signal, and an output that provides a first comparison signal;

a second comparator having a first input that receives the second reference voltage, a second input connected to the switching circuit for receiving the second voltage signal, and an output that provides a second comparison signal; and a logic gate connected to the first and second comparators for receiving the first and second comparison signals, and outputting the oscillating signal.

5. The charge pump of claim 1, wherein the frequency divider is a divide-by-2 counter.

6. The charge pump of claim 1, further comprising a fifth diode having an anode that receives the supply voltage and a cathode connected to the cathodes of the third and fourth diodes.

7. A charge pump, comprising:

a frequency divider for receiving an oscillating signal and generating a clock signal;

a clock generation circuit connected to the frequency divider for receiving the clock signal and generating first and second clock signals having first and second phases, respectively;

a current mirror circuit that receives a supply voltage and generates first and second current signals based on a reference current signal;

a switching circuit, comprising:

a first switch having a first terminal for receiving a first reference voltage and a second terminal connected to the clock generation circuit for receiving the first clock signal;

a second switch having a first terminal for receiving the first reference voltage and a second terminal connected to the clock generation circuit for receiving the second clock signal;

a third switch having a first terminal connected to the current mirror circuit for receiving the first current signal, a second terminal connected to the clock generation circuit for receiving the first clock signal, and a third terminal connected to a third terminal of the first switch for generating a first voltage signal; and a fourth switch having a first terminal connected to the current mirror circuit for receiving the second current signal, a second terminal connected to the clock generation circuit for receiving the second clock signal, and a third terminal connected to a third terminal of the second switch for generating a second voltage signal;

first and second diodes having anodes that receive the supply voltage;

first and second capacitors having first terminals connected to the switching circuit for receiving the first and second voltage signals, respectively, and second terminals connected to cathodes of the first and second diodes, respectively;

a comparator that receives a second reference voltage, and is connected to the switching circuit for receiving the first and second voltage signals, compares the first and second voltage signals with the second reference voltage, and generates the oscillating signal;

third and fourth diodes having anodes connected to the cathodes of the first and second diodes, respectively, wherein a cathode of the third diode is connected to a cathode of the fourth diode for generating an output signal;

a voltage detector connected to the cathodes of the third and fourth diodes for receiving the output signal and generating a voltage detection signal indicative of a voltage level of the output signal; and a voltage controlled current source (VCCS) connected to the voltage detector for receiving the voltage detection signal and generating the reference current signal.

8. The charge pump of claim 7, further comprising a third capacitor having a first terminal connected to the cathodes of the third and fourth diodes for receiving the output signal and a second terminal connected to ground.

9. The charge pump of claim 7, wherein the comparator comprises:
- a first comparator having a first input that receives the second reference voltage, a second input connected to the switching circuit for receiving the first voltage signal, and an output that provides a first comparison signal;
- a second comparator having a first input that receives the second reference voltage, a second input connected to the switching circuit for receiving the second voltage signal, and an output that provides a second comparison signal; and
- a logic gate connected to the first and second comparators for receiving the first and second comparison signals and outputting the oscillating signal.

10. The charge pump of claim 7, wherein the frequency divider is a divide-by-2 counter.

11. The charge pump of claim 7, further comprising a fifth diode having an anode that receives the supply voltage and a cathode connected to the cathodes of the third and fourth diodes.

* * * * *